United States Patent [19]
Loubriel et al.

[11] Patent Number: 5,804,815
[45] Date of Patent: Sep. 8, 1998

[54] GAAS PHOTOCONDUCTIVE SEMICONDUCTOR SWITCH

[75] Inventors: Guillermo M. Loubriel, Sandia Park; Albert G. Baca; Fred J. Zutavern, both of Albuquerque, all of N. Mex.

[73] Assignee: Sandia Corporation, Albuquerque, N. Mex.

[21] Appl. No.: 675,975

[22] Filed: Jul. 5, 1996

[51] Int. Cl.$^6$ ....................................................... H01J 40/14
[52] U.S. Cl. ............................... 250/214.1; 250/214 LS; 257/444
[58] Field of Search ........................... 250/214.1, 214 R, 250/208.1, 370.14, 370.01, 370.08, 372, 338.4, 214 LS; 257/440–449, 431, 430, 428, 336

[56] References Cited

U.S. PATENT DOCUMENTS 4,679,063 7/1987 White et al. ............................. 257/449
5,567,971 10/1996 Jackson et al. .......................... 257/431

OTHER PUBLICATIONS

G. M. Loubriel, M. W. O'Malley, and F. J. Zutavern, Sandia National Laboratories, Albuquerque, New Mexico, Toward Pulsed Power Uses for Photoconductive Semiconductor Switches: Closing Switches, 6$^{th}$ IEEE Pulsed Power Conference, Arlington, VA, 1987, Jan. 1987.

A. G. Baca, H. P. Hjalmarson, G. M. Loubriel, D. L. McLaughlin, and F. J. Zutavern, Sandia National Laboratories, Albuquerque, New Mexico, High Current Density Contacts of GaAs Photoconductive Semiconductor Switches, pp. 84–87, International Pulsed Power Conference, Jan. 1993.

G. M. Loubriel, F. J. Zutavern, M. W. O'Malley, R. R. Gallegos, W. D. Helgeson, H. P. Hjalmarson, A. G. Baca and T. A. Plut, Sandia National Labortories, Albuquerque, New Mexico, High Gain GaAs Switches for Impulse Sources; Measurement of the Speed of Current Filaments, Proceedings of the 21$^{st}$ Power Modulator Symposium, Jun. 27–30, 1994, Costa Mesa, California.

G. M. Loubriel, F. J. Zutavern, A. G. Baca, H. P. Hjalmarson, W. D. Helgeson, and M. W. O'Malley, High Power Electromagnetics and Compound Semiconductor Technology Departments, Sandia National Laboratories, Albuquerque, New Mexico, Photoconductive Semiconductor Switches for Firing Sets and Electro–Optic Modulators, 10$^{th}$ IEEE International Pulsed Power Conference, Jul. 10–13, 1995, Albuquerque, New Mexico.

*Primary Examiner*—Que Le
*Attorney, Agent, or Firm*—Gregory A. Cone

[57] ABSTRACT

A high gain, optically triggered, photoconductive semiconductor switch (PCSS) implemented in GaAs as a reverse-biased pin structure with a passivation layer above the intrinsic GaAs substrate in the gap between the two electrodes of the device. The reverse-biased configuration in combination with the addition of the passivation layer greatly reduces surface current leakage that has been a problem for prior PCSS devices and enables employment of the much less expensive and more reliable DC charging systems instead of the pulsed charging systems that needed to be used with prior PCSS devices.

14 Claims, 2 Drawing Sheets

GAAS PHOTOCONDUCTIVE SEMICONDUCTOR SWITCH

This invention was made with Government support under Contract DE-C04-4AL85000 awarded by the U. S. Department of Energy. The Government has certain rights in the invention.

BACKGROUND OF THE INVENTION

This invention relates to photoconductive semiconductor switches. More particularly, this invention relates to such switches implemented in gallium arsenide that have electric fields in excess of the lock-on voltage impressed across their terminals at the time laser light is directed upon them to trigger the mobilization of the charge carriers in the switch.

Photoconductive semiconductor switches (PCSS) based on the lock-on effect have previously been fabricated in both Si and GaAs. The switches discussed herein are GaAs switches 10 laid out in a generic lateral configuration as shown in FIG. 1. Two electrodes 12, 14 are emplaced above a semi-insulating GaAs substrate 18, with gap 16 between the two electrodes being exposed to light which triggers the switch 10. At electric fields below about 4 kV/cm, GaAs switches are activated by the creation of, at most, one electron hole pair per photon absorbed. This linear mode demands high laser power, and, after the laser light is extinguished, the carrier density decays exponentially in 1–10 ns. At higher electric fields these switches behave very differently. On triggering, the high field induces carrier multiplication so that the amount of light required is reduced by as much as five orders of magnitude. The switches are often termed as 'high gain' because of this effect. We have used trigger energies as low as 180 nJ to deliver 48 MW in a 30–50 ohm system. In the 'on' state the field across the switch stabilizes to a constant called the lock-on field. The switch current is circuit-limited provided the circuit maintains the lock-on field. As the initial (prior to triggering) field increases, the switch risetime decreases and the trigger energy is reduced. During high gain switching the switches emit bandgap radiation due to carrier recombination. When this radiation is imaged, filaments are observed, even if the triggering radiation is uniform. The filaments can have densities of $MA/cm^2$ and diameters of 15–300 $\mu m$.

These switches can be used for pulsed power applications as diverse as low impedance, high current pulsers and high impedance, low current Pockels cell or Q switch drivers. Advances in this technology offer improvements over alternative switching schemes, i.e. 100 ps risetime, kilohertz (continuous) and megahertz (burst) repetition rates, scalable or stackable to hundreds of kilovolts and tens of kiloamps, optical control and isolation, and inherent solid state reliability.

However, existing PCSS switches require a rather complicated pulsed power supply because surface current leakage in the switches prevents the use of the simpler DC power supplies. What is needed is an improved GaAs PCSS with high OFF resistance that can be utilized with these DC charging systems.

SUMMARY OF THE INVENTION

The photoconductive semiconductor switch of this invention comprises an intrinsic GaAs substrate implemented as a reverse biased pin structure including a passivation layer over the substrate in the gap between the two electrodes of the device. The addition of the passivation layer greatly improves the OFF resistance of the device, enabling its use with a variety of different power supplies. The triggering light is preferably supplied by laser diodes.

DETAILED DESCRIPTION OF THE INVENTION

The following descriptions are of two different embodiments of the PCSS of this invention. The first is for a high current device designed to be used in a firing set for explosives. The very high current densities generally limit the switches to a single application. The second example is for high duty rate application of controlling a Pockels cell that in turn controls a laser. By using larger dimensions for the switch and lower currents, the current density within the switch is reduced and the lifetime is considerably increased (>50,000 cycles).

High Current, Compact Laser, and High Off Resistance

Conventional high current firing sets are complex, demanding systems consisting of a power supply, high voltage capacitor, high voltage vacuum tube switch, and resistive detonator or bridge which launches a flyer at high velocity. The system requirements on the high voltage switch demand precise timing, small volume, high voltage, high current, and very low inductance to produce fast current risetimes with a sub-$\Omega$ load. PCSS are being developed for firing sets because of their extremely fast switching and small physical volume and because they utilize standard semiconductor processing techniques with predictably low failure rates. The specific system that we have tested consists of a 120 nF ceramic capacitor which is discharged through the switch into a 0.25 $\Omega$ load. The capacitor is either dc or pulse charged to 3 kV. When the switch is triggered, the current waveform must have a risetime of <30 ns with a peak current of 3 kA. Although this circuit seems to be a simple RC circuit, stray inductance and the inductance in the capacitor and switch are large enough to affect the waveform. In practice the system's inductance determines the risetime and peak value of the current waveform.

The most important demands of the firing set application are: high current, low inductance, high dc voltage standoff, high resistance prior to switching, and small size (including the trigger laser).

Figure 2:
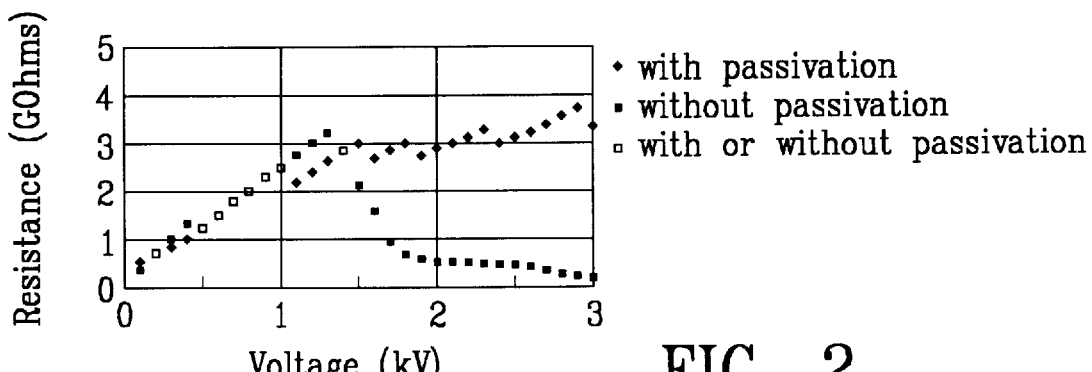
FIG. 2 is a graph showing the resistance of passivated and unpassivated PCSS (size of gap between electrodes being 1 mm wide and 5 mm apart) devices at different voltages.

In a preliminary experiment, we first demonstrated low inductance, high current switching with a pulse-charged capacitor. This is shown in FIG. 2. The current waveform peaks at 2.9 kA (for a charge voltage of 3 kV), with a risetime of 27 ns. The switches that we used for this demonstration were n-i-n, with Ni—Ge—Au—Ni—Au metallization for each of the n contacts. Their insulating region separating the two contacts was 0.5 mm (the active length), the total contact width was 5.0 mm. Because of high electric fields the switches were immersed in a dielectric liquid (Fluorinert®). Pulse charging of this configuration was required because the resistance across the switch, prior to switching, (the "off resistance") was about 1MΩ. Also, continued bias at high voltage results in heating and further reductions of the resistance. For this test, a laser diode array was used to trigger the switch. The array consisted of three laser diodes coupled to a 400 $\mu$m fiber optic. The array delivered 1.6 $\mu$J in 27 ns at 808 nm to illuminate the switch. The circuit that powered this laser was not optimized for size. It occupied an area of about 5 cm by 5 cm and required a 40 V trigger and a 400 V supply.

To demonstrate that the laser diode array electronics could be made considerably smaller we also developed a compact driver that consisted of a ceramic capacitor (4.7 nF) and an avalanche transistor coupled to a similar laser diode array. The trigger voltage was reduced to 5 V. The overall size was 4×8×1 mm$^3$ with a wavelength of 880 nm and an energy of 1.36 $\mu$J. The pulse width was 19 ns, with a risetime of about 6 ns. The pulse width was reduced because the GaAs carrier lifetime is about 10 ns. The laser illuminated the switch directly without the use of a fiber optic.

Figure 3:
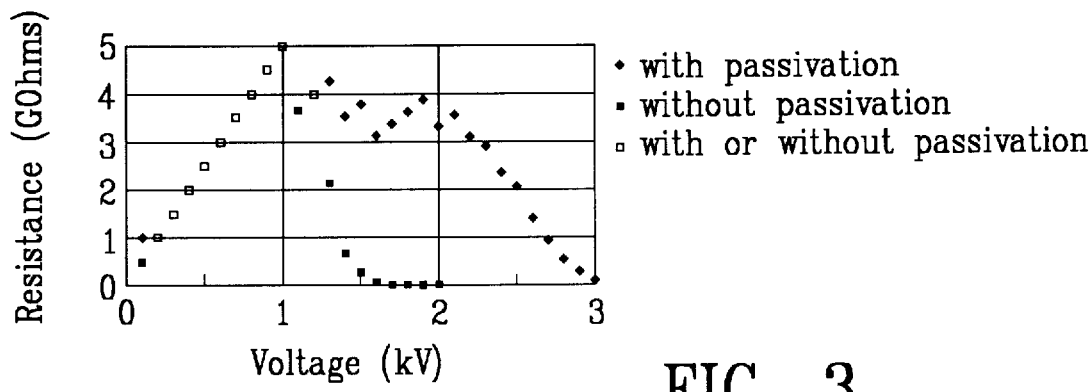
FIG. 3 is a graph showing the resistance of passivated and unpassivated PCSS (size of gap between electrodes being 0.5 mm wide and 2.5 mm apart) devices at different voltages.

An important system requirement for the switch is an off resistance greater than 100MΩ, a result not achieved in the preliminary experiment recited above. High off resistance allows dc charging of the switch and reduces leakage current, thereby reducing system size and complexity, and increasing safety. By redesigning the switches, changing the dielectric liquid that surrounds the switch, and passivating the surfaces, we discovered that resistances as high as 5 GΩ could be obtained for this application. The switches used to achieve high off resistance were p-i-n switches with Ge—Au—Ni—Au for the n contact and Au—Be for the p contact. The switches were tested with reverse bias (dc). FIGS. 2 and 3 show the effect of passivation on the resistance vs. voltage curve. FIG. 2 shows data for switches with an insulating region that was 1 mm long and 5 mm wide. The passivated switch had high resistance at dc voltages as high as 3 kV (250MΩ at 3 kV). FIG. 3 shows similar results with switches that were 0.5 mm long and 2.5 mm wide. The resistance of the passivated switch was 140MΩ at 3 kV and for the unpassivated switch the resistance is down to 5.7MΩ when tests were stopped at 2 kV. This shows that it is the surface leakage that was causing the low resistance for the unpassivated switches.

Switches were then operated at high dc voltage. The p-i-n switch used was a 0.5 mm long by 2.5 mm wide. The switch was reverse biased, dc charged to 3 kV, and triggered with the fiber optic coupled array. The peak current was about 2.7 kA with a risetime of 21 ns. The volume of this system, including the laser diode driver discussed above, was about 40 mm$^3$ and the cost was of the order of $200, both significant improvements over prior systems.

High Gain GaAs for Electro-Optic Modulators

Figure 4:
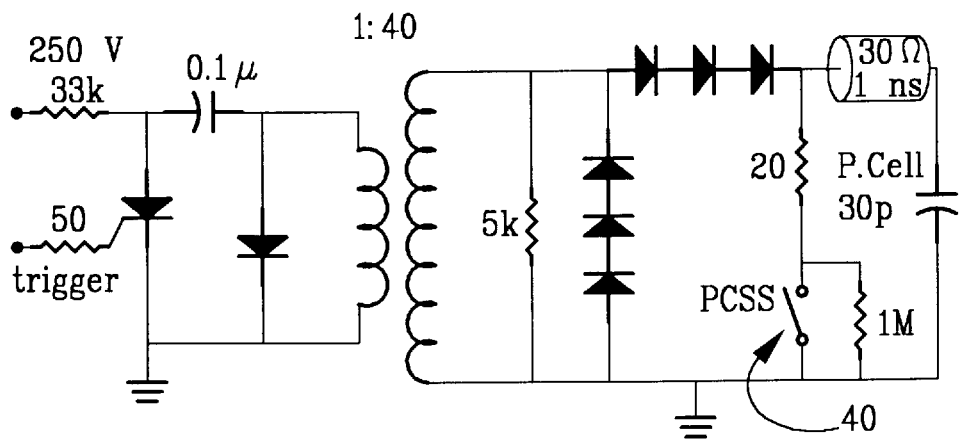
FIG. 4 is a circuit schematic showing a PCSS controlling a Pockels cell.

An important application of high gain PCSS is in the production of fast voltage risetimes that control an electro-optic modulator such as a Pockels cell or a Q-switch. In this experiment we have placed a Pockels cell in the output of a Nd:YAG (1064 nm) laser. The laser pulse has a duration of about 30 ns. We desired to demonstrate electro-optic modulation by allowing only half of the laser pulse to be transmitted. The crucial parameter is the risetime of the off to on transition that needs to be reduced to below one nanosecond. Electrically, the Pockels cell is a capacitor of about 30 pF. The circuit of FIG. 4 charges this capacitance and keeps it charged while the first part of the laser pulse enters the Pockels cell. Then the high gain PCSS 40 is activated and the switch shorts the capacitance of the Pockels cell. The current risetime determines the risetime or falltime of the optical transition. The optical signal achieved the risetime goal with a risetime of 600 ps. This circuit utilized an unpassivated nin PCSS and was necessarily pulse-charged. The reverse-biased and passivated pin PCSS of the present invention provides equivalent performance with the significant advantage of being able to use a DC charging circuit.

Fabrication

Figure 1:
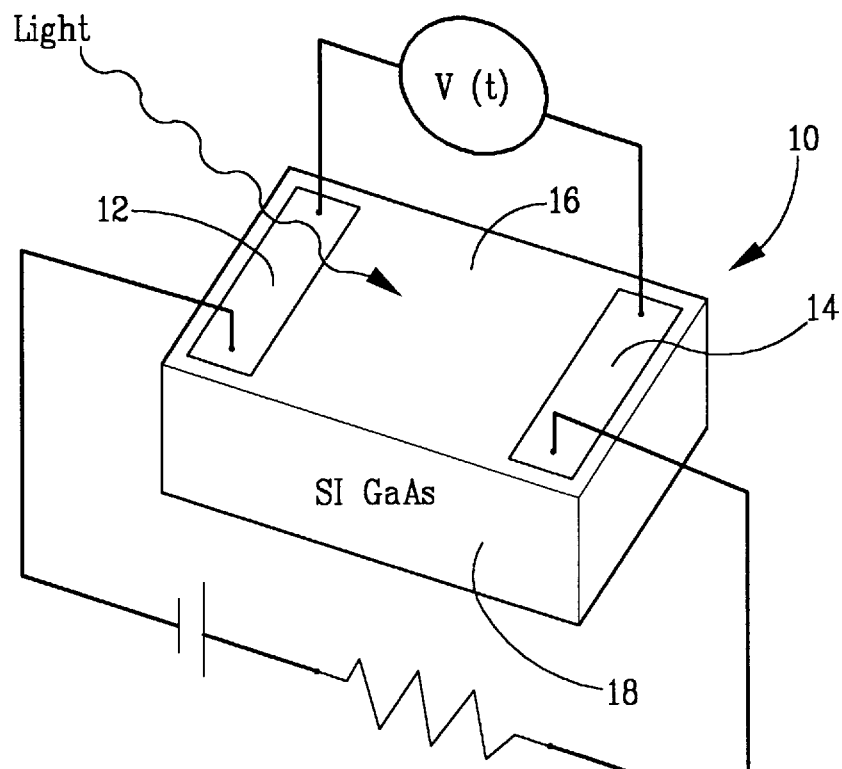
FIG. 1 is an isometric view of a PCSS.
Figure 5:
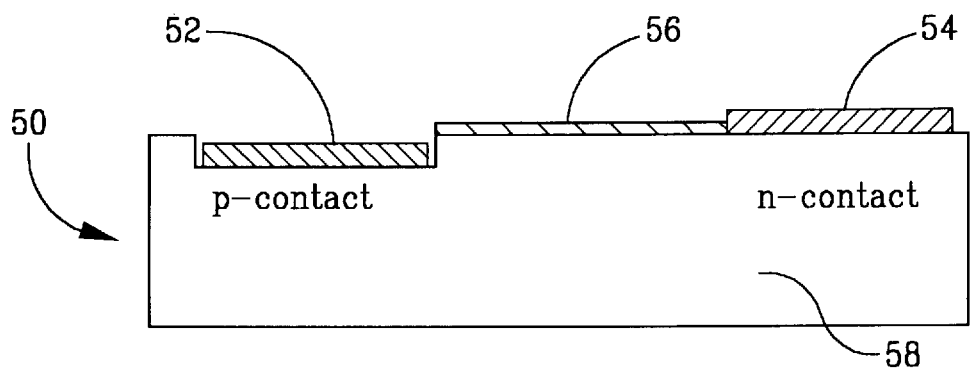
FIG. 5 is a cross-sectional view of a PCSS with the p contact formed in an etched depression.

The semi-insulating GaAs wafers were of the liquid encapsulated czochralski (LEC) type, which contain 1–2× 10$^{16}$ cm$^{-2}$EL2 traps to obtain high resistivity in excess of 10$^7$ Ω –cm. Prior to switch fabrication the surfaces were etched for 3 minutes in a 5:1:1::H$_2$SO$_4$:H$_2$O$_2$:H$_2$O solution at 70° C. in order to remove polishing damage and surface contamination. Lateral switches 10, 50 were fabricated with microelectronic fabrication techniques. Ohmic metal was then evaporated with an electron beam deposition system and lifted off with solvent soaks. Both n-type GeAuNiAu, hereafter referred to as AuGe, and p-type AuBe (2% Be) industry standard ohmic metals were employed. The n-type ohmic contact ohmic contact was evaporated as follows: 260 Å Ge, 540 Å Au, 150 Å Ni, and 2000 Å Au. The AuBe contact 12, 52 were evaporated concurrently to a total thickness of 3000 Å. The lateral switch illustrated in FIG. 1 is designated according to the contact configuration as pin, representing the ohmic contact type at each electrode and the intrinsic semiconductor between electrodes. On some pin switches 50 a wet etch was employed to remove=4000 Å of GaAs before the p-type contact 52 evaporation and are designated as etched pin samples as shown in FIG. 5. The particular etched p-contact strategy appears to reduce damage effects on the electrode caused by high current densities. The etched depression can be about 0.5 to 1.0 $\mu$m deep. The passivation layer 56 used was SiN$_x$ emplaced in a high temperature deposition (250° C.) to a thickness of about 4000 Å, although other thicknesses would also perform satisfactorily. Although not tested, it is anticipated that other passivation materials such as sulfur, SiO$_2$, polyimide and other organic polymers would also work for the passivation layer material. The PCSS ohmic contacts were alloyed at temperatures of either 370° C. or 470° C. for 15 seconds with a rapid, thermal annealer. A TiPtAu bond pad layer was then patterned and lifted off The switches were then diced, soldered to a fixture, and tested.

These high OFF resistance PCSS have been demonstrated as useful in firing sets and laser modulators. Other uses include voltage pulsers and switches for electrostatic discharge guns used to test instruments and computers for resistance to ESD. Other uses are of course possible. The true scope of the invention is to be found in the appended claims.

We claim:

1. A photoconductive semiconductor switch comprising:
   an intrinsic GaAs substrate;
   a p-type ohmic electrode located on the upper surface of the substrate;
   an n-type ohmic electrode located on the upper surface of the substrate and spaced apart from the p-type electrode to form a gap therebetween on the upper surface of the substrate; and
   a passivation layer atop the substrate in the gap.

2. The switch of claim 1 wherein the p-type metallization is AuBe and the n-type metallization is GeAuNiAu.

3. The switch of claim 1 wherein the passivation layer is selected from the group consisting of $SiN_x$, $SiO_2$, and organic polymers.

4. The switch of claim 1 wherein the passivation layer is $SiN_x$.

5. The switch of claim 1 wherein the thickness of the pass. layer is about 0.5 µm.

6. The switch of claim 1 wherein the p-type electrode is formed in an etched depression.

7. The switch of claim 1 further comprising means to place a reverse-biased electric field across the electrodes and means to illuminate the gap.

8. The switch of claim 7 wherein the average electric field is a DC field and has an average field strength greater than about 5 kV/cm.

9. The switch of claim 8 wherein the means to illuminate the gap produces laser light of sufficient intensity and at the proper wavelength to create carrier multiplication within the switch in conjunction with necessary electric field strength.

10. The switch of claim 7 wherein the means to illuminate the gap comprises at least one laser diode or laser diode array.

11. A photoconductive semiconductor switch system comprising:

an intrinsic GaAs substrate;

a p-type ohmic electrode located on the upper surface of the substrate;

an n-type ohmic electrode located on the upper surface of the substrate and spaced apart from the p-type electrode to form a gap therebetween on the upper surface of the substrate;

a passivation layer atop the substrate in the gap;

means to place a reverse-biased electric field across the electrodes; and means to illuminate the gap.

12. The switch system of claim 11 wherein the average electric field is a DC field and has an average field strength greater than about 5 kV/cm.

13. The switch system of claim 11 the means to illuminate the gap produces laser light of sufficient intensity and at the proper wavelength to create carrier multiplication within the switch in conjunction with necessary electric field strength.

14. The switch system of claim 11 wherein the means to illuminate the gap comprises at least one laser diode or laser diode array.

* * * * *